(12) United States Patent
Hess et al.

(10) Patent No.: US 11,005,459 B1
(45) Date of Patent: May 11, 2021

(54) EFFICIENT RETENTION FLOP UTILIZING DIFFERENT VOLTAGE DOMAIN

(71) Applicant: Apple Inc., Cupertino, CA (US)

(72) Inventors: Greg M. Hess, Mountain View, CA (US); Vivekanandan Venugopal, San Jose, CA (US); Victor Zyuban, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/391,085

(22) Filed: Apr. 22, 2019

(51) Int. Cl.
*H03K 3/037* (2006.01)
*G11C 19/18* (2006.01)
*H03K 3/356* (2006.01)

(52) U.S. Cl.
CPC ......... *H03K 3/0372* (2013.01); *G11C 19/184* (2013.01); *H03K 3/35606* (2013.01); *H03K 3/356078* (2013.01)

(58) Field of Classification Search
None
See application file for complete search history.

(56) References Cited

U.S. PATENT DOCUMENTS

| | | | | |
|---|---|---|---|---|
| 6,445,210 | B2* | 9/2002 | Nojiri | H03K 3/356113 326/68 |
| 9,059,687 | B2 | 6/2015 | Ramaraju et al. | |
| 9,948,303 | B2* | 4/2018 | Narayanan | H03K 19/0963 |
| 10,033,356 | B2 | 7/2018 | Wang et al. | |
| 10,115,450 | B1* | 10/2018 | DeBrosse | G11C 11/4082 |
| 2007/0223289 | A1* | 9/2007 | Lee | G11C 16/12 365/189.11 |
| 2009/0015321 | A1 | 1/2009 | Hamdan et al. | |
| 2009/0052246 | A1* | 2/2009 | Bertin | B82Y 10/00 365/185.08 |
| 2012/0182056 | A1 | 7/2012 | Dally et al. | |
| 2014/0210516 | A1* | 7/2014 | Hwang | H03K 19/01855 326/80 |
| 2015/0279451 | A1* | 10/2015 | Jung | G11C 11/418 365/154 |
| 2016/0146887 | A1 | 5/2016 | Lou et al. | |

\* cited by examiner

*Primary Examiner* — Lincoln D Donovan
*Assistant Examiner* — Khareem E Almo
(74) *Attorney, Agent, or Firm* — Kowert Hood Munyon Rankin and Goetzel PC; Rory D. Rankin (57) ABSTRACT

A system and method for efficiently retaining data in sequential elements during power down modes. In various embodiments, a master latch of a flip-flop circuit receives an always-on first power supply voltage, whereas, a slave latch and other surrounding circuitry receives a second power supply voltage capable of being powered down. During a power down mode, circuitry consumes less power while the master latch retains stored data. In some designs, the flip-flop circuit is a level shifting circuit, and the always-on first power supply voltage is less than the second power supply voltage. The master latch uses complex gates with a p-type transistor at the top of a stack of p-type transistors receiving the always-on power supply voltage level on its source terminal and the retained data value on its gate terminal. This top p-type transistor is capable of remaining disabled even when used in a level shifting manner.

20 Claims, 8 Drawing Sheets

EFFICIENT RETENTION FLOP UTILIZING DIFFERENT VOLTAGE DOMAIN

BACKGROUND

Technical Field

Embodiments described herein relate to the field of computing systems and, more particularly, to efficiently retaining data in sequential elements during power down modes.

Description of the Related Art

Various integrated circuits (ICs) include more than one power supply. Each power supply conveys a power supply signal at a different voltage from the other power supplies. In some ICs, one or more voltage regulators are used to generate power signals of varying voltage levels from a single power supply. The various power signals are used by different circuits in an IC, each power signal supplying power in a respective power domain.

Sequential elements are used for storing and driving data in a variety of circuits such as general-purpose central processing unit (CPU), data parallel processors like graphics processing units (GPUs), digital signal processors (DSPs), and so forth. Modern processors are typically pipelined. For example, the processors include one or more data processing stages connected in series with sequential elements placed between the stages for storing and driving the data. The output of one stage is made the input of the next stage during each transition of a clock signal. The sequential elements typically are flip-flop circuits. During power down modes, the power supply voltage is reduced to a ground reference voltage level to reduce power consumption. However, when sequential elements are powered off, the stored data is not retained.

In view of the above, methods and mechanisms for efficiently retaining data in sequential elements during power down modes are desired.

SUMMARY

Systems and methods for efficiently retaining data during power down modes are contemplated. In various embodiments, a flip-flop circuit used throughout a functional unit includes a master latch. In some embodiments, the flip-flop circuit receives a first power supply voltage level and a second power supply voltage level. In an embodiment, the first power supply voltage level referred to as VIN1 does not decrease to a ground reference voltage, whereas, the second power supply voltage level referred to as VIN2 is capable of reducing to the ground reference voltage level during a power down operating mode. In addition, VIN1 is smaller than VIN2. In other embodiments, the two power supply voltage levels VIN1 and VIN2 have other relationships. In an embodiment, the master latch uses VIN1 and not VIN2. In an embodiment, the circuitry surrounding the master latch uses VIN2 and not VIN1. Therefore, when a power management unit determines a functional unit transitions to a power down mode, the slave latch of the flip-flop circuit and other circuitry that uses VIN2 receives the ground reference voltage level, whereas, the master latch continues to receive a positive, non-zero voltage level of VIN1. The transition to the power down mode causes the functional unit to consume less power while the master latch retains a stored data value of the master latch.

In various embodiments, each of a control path providing a clock signal to the flip-flop circuit and a data path providing a data input signal to the flip-flop circuit receives VIN2 reduced to the ground reference voltage level. In an embodiment, to transition to the power down mode, the circuitry asserts an isolate signal, or transitions the isolate signal from the ground reference voltage level to VIN1. In an embodiment, the circuitry includes a Boolean NOR gate using VIN2 that can be powered down to generate a clock signal for the master latch based on each of an enabled clock signal using the second power supply voltage level and the isolate signal using the always-on first power supply voltage level. Therefore, when the circuitry asserts the isolate signal, the master latch closes and retains its stored state based on VIN1.

In an embodiment, the master latch uses two Boolean AND-OR-INVERT (AOI) complex gates. In the stack of p-type transistors of the AOI complex gates, a single p-type transistor, which receives VIN1 on its source terminal, is at the top of the stack in series with two parallel p-type transistors. This single p-type transistor receives the retained state of the master latch, which is driven by VIN1, on its gate terminal. In contrast, the other p-type transistors in the stack of p-type transistors receive the input data signal and the clock signal using VIN2. When either of the data input signal or the clock signal is asserted, the other p-type transistors receive VIN2 on their gate terminals. Since the top-of-the-stack, single p-type transistor receives VIN1, which is the smaller, always-on first power supply voltage level in some embodiments, this single p-type transistor is capable of becoming disabled even when used in a level shifting manner.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Figure 1:
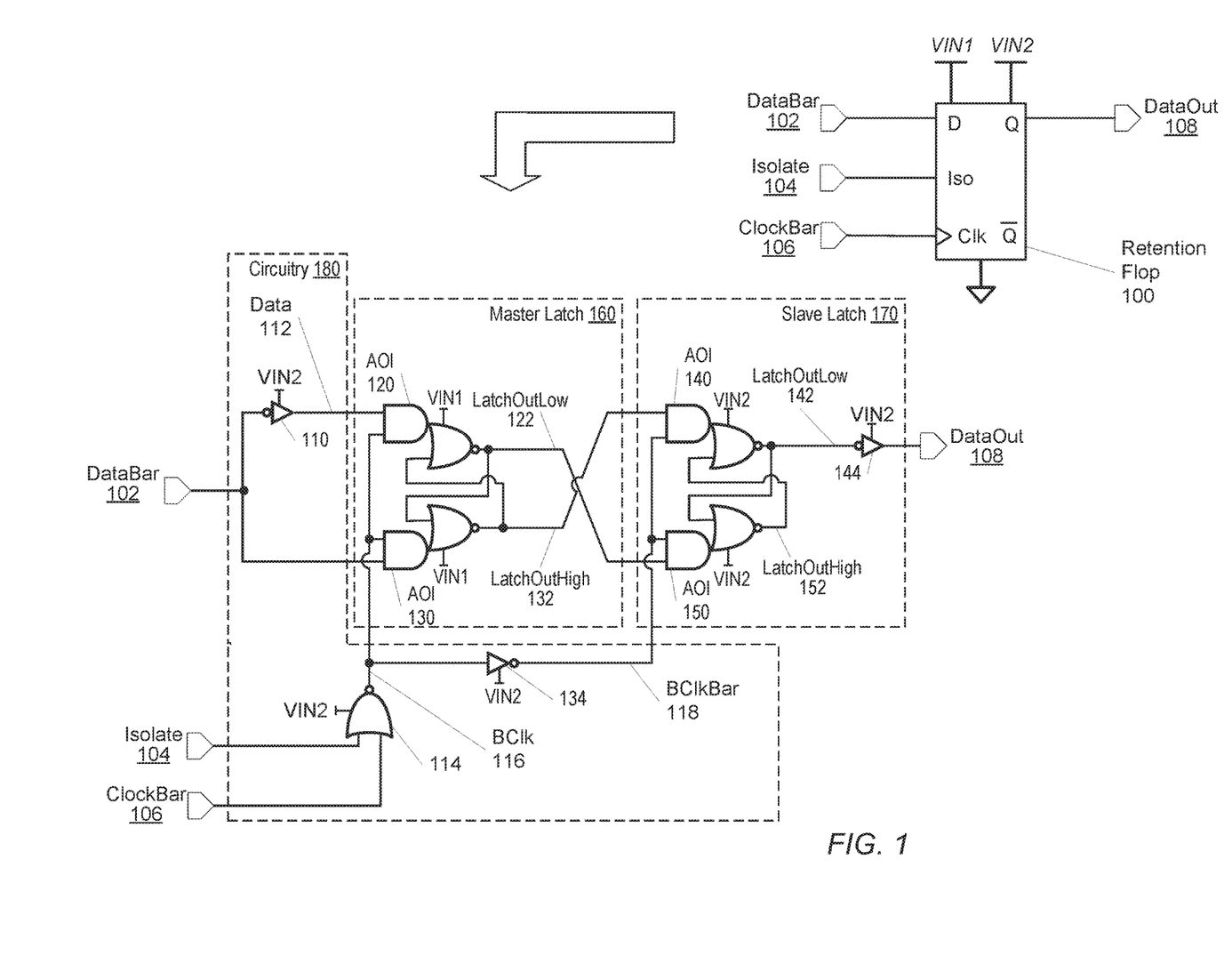
FIG. 1 is a block diagram of one embodiment of a retention flip-flop circuit.

Referring to FIG. 1, a generalized block diagram of one embodiment of a retention flip-flop circuit 100 is shown. In various embodiments, the retention flip-flop circuit 100 (or flip-flop 100) receives a Databar signal 102, an Isolate signal 104 and a ClockBar signal 106, and conveys at least a DataOut signal 108. The flip-flop 100 also receives a ground reference voltage level and two power supply voltages designated as "VIN1" and "VIN2." Each of the power supply voltages VIN1 and VIN2 is also referred to as the power supply signals VIN1 and VIN2 or the supply voltages VIN1 and VIN2. The power supply signals VIN1 and VIN2 are capable of having a same voltage level. In addition, VIN1 and VIN2 are capable of having different voltage levels with one at a higher voltage level than the other. In other words, the power supply voltages VIN1 and VIN2 are capable of supporting the relationships VIN1<VIN2, VIN1>VIN2, and VIN1=VIN2. Further, each of the power supply voltages VIN1 and VIN2 is capable of being powered down to the ground reference voltage level during the power down operating mode. In an embodiment, the flip-flop 100 stores new values of the DataBar signal 102 when the Isolate signal 104 is reduced to the ground reference voltage level and the ClockBar signal 106 is increased to the second power supply voltage VIN2.

Control logic, such as a power management unit, within a computing system determines one or more operating states for different functional units of the computing system. One or more of these functional units use the flip-flop 100 for storing data. The operating state includes one or more of a power supply voltage and an operational clock frequency. In addition, the power management unit determines one or more operating modes for the different functional units. The operating modes include a sleep mode where one or more blocks of logic are powered off, an idle mode where one or more blocks of logic use clock enable signals to disable the clock signals, and one or more active modes, each with a different operating state.

In some embodiments, the power supply voltage VIN1 is an always-on power supply voltage that is not powered down to the ground reference voltage level during a power down operating mode. In contrast to the always-on power supply voltage VIN1, in an embodiment, the power supply voltage VIN2 is powered down to the ground reference voltage level during the power down operating mode. Therefore, the power supply voltages VIN1 and VIN2 are from separate power supply domains in the computing system. In other embodiments, the power supply voltage VIN1 is also capable of being powered down to the ground reference voltage level during the power down operating mode. Therefore, in some cases, each of VIN1 and VIN2 is powered down to the ground reference voltage level during the power down operating mode, whereas in other cases, only VIN2 is powered down to the ground reference voltage level during the power down operating mode.

In various embodiments, the flip-flop 100 uses a master latch 160, a slave latch 170 and circuitry 180. In some embodiments, the master latch 160 also includes the logic gates, such as the inverters 110 and 134 as well as the Boolean NOR gate 114, of the circuitry 180. In other embodiments, these logic gates 110, 114 and 134 of circuitry 180 are placed externally from the master latch 160 as shown. In some embodiments, each of the master latch 160 and the slave latch 170 uses a Boolean AND-OR-INVERT (AOI) gate to implement a latching function. For example, the master latch 160 uses the AOI gate 120 to generate the LatchOutLow signal 122, which is an intermediate signal, or internal state, of the flip-flop 100. Similarly, the master latch 160 uses the AOI gate 130 to generate the LatchOutHigh signal 132, which is also an intermediate signal, or an internal state, of the flip-flop 100 that is also the inverse of the LatchOutLow signal 122. Each of the AOI gates 120 and 130 of the master latch uses the power supply voltage VIN1, whereas the logic gates 110, 114 and 134 use the power supply voltage VIN2. In addition, the slave latch 170 uses the power supply voltage VIN2.

In various embodiments, each of the AOI gates 120 and 130 uses transistors to receive and generate signals. For example, in an embodiment, the AOI gates 120 and 130 uses transistors such as p-type metal oxide semiconductor (PMOS) transistors and n-type metal oxide semiconductor (NMOS) transistors. In some embodiments, the transistors are field effect transistors (FETs). Transistors are also referred to as devices. Therefore, the PMOS transistor is also referred to as a p-type device. Similarly, the NMOS transistor is also referred to as an n-type device. The use of the two types of devices in the flip-flop 100 ensures the signals on intermediate nodes and the DataOut signal 108 provides either a Boolean logic high value or a Boolean logic low value.

Typically, a signal is considered to be asserted when the signal has a value used to enable logic and turn on transistors to cause the transistor to conduct current. For some logic, an asserted value is a Boolean logic high value or a Boolean logic high level. For example, when an NMOS transistor receives a Boolean logic high level on its gate terminal, the NMOS transistor is enabled, or otherwise turned on, and the NMOS transistor is capable of conducting current. For other logic, an asserted value is a Boolean logic low level. In contrast, when a PMOS transistor receives a Boolean logic low level on its gate terminal, the PMOS transistor is enabled, or otherwise turned on, and the PMOS transistor is capable of conducting current. A Boolean logic high level is also referred to as a logic high level. Similarly, a Boolean logic low level is also referred to as a logic low level.

In contrast to a particular signal being asserted, the particular signal is considered to be negated when the signal has a value used to disable logic and turn off transistors to prevent the transistor from conducting current. For n-type devices, the particular signal received on the gate terminal of an n-type device with a logic low level turns off the n-type device, so the particular signal is considered to be negated. For p-type devices, the particular signal received on the gate terminal of a p-type device with a logic high level turns off the p-type device, so the particular signal is considered to be negated.

The master latch 160 implemented with the two AOI gates 120 and 130 receives the Data signal 112 using the AOI gate 120, and receives the DataBar signal 102 using the AOI gate 130. The inverter 110 of circuitry 180 generates the Data signal 112 from the DataBar signal 102. Although the flip-flop 100 is shown to receive an inverted data signal, such as DataBar 102, in other embodiments, the flip-flop 100 receives a non-inverted data signal from previous logic generating the data signal. Each of the AOI gates 120 and 130 also receives a clock signal shown as the BClk signal 116. The Boolean NOR gate 114 of circuitry 180 generates the BClk signal 116 from the Isolate signal 104 and the ClockBar signal 106. Similar to the inverted data input signal, in other embodiments, the flip-flop 100 receives a non-inverted clock signal from previous logic generating the clock signal.

Although not shown, in various embodiments, external circuitry uses a variety of types of logic and staging with sequential elements to combine a source clock signal and a clock enable signal in order to generate the ClockBar signal 106. Additionally, although not shown, in various embodiments, external circuitry uses a variety of types of logic to combine a data input signal and scan input signals in order to generate the DataBar signal 102. In an embodiment, the flip-flop 100 includes some or all of this external circuitry. Therefore, in other embodiments, the flip-flop 100 receives further inputs and provides data scanning and clock enabling capabilities.

When an external power management unit determines a functional block using the flip-flop 100 is transitioning to (or is maintaining at) an active mode, the power management unit negates the Isolate signal 104. For example, the power management unit transitions the Isolate signal 104 to the logic low level. If the Isolate signal 104 is already at the logic low level, then the power management unit maintains the Isolate signal 104 at the logic low level. During these cases, the NOR gate 114 generates the BClk signal 116 by inverting the ClockBar signal 106. When the ClockBar signal is at a logic low level, the NOR gate 114 generates the BClk signal 116 at a logic high level, and the master latch 160 opens. For example, the AOI gates 120 and 130 of the master latch 160 generate the LatchOutLow signal 122 and the LatchOutHigh signal 132 based on the received Data signal 112 and the DataBar signal 102. The AOI gate 120 generates the LatchOutLow signal 122 by inverting the received Data signal 112, and the AOI gate 130 generates the LatchOutHigh signal 132 by inverting the received DataBar signal 102.

When the Isolate signal 104 is at the logic low level and the ClockBar signal 106 is at the logic high level, the NOR gate 114 generates the BClk signal 116 at a logic low level, and the master latch 160 closes. For example, the AOI gates 120 and 130 generate the LatchOutLow signal 122 and the LatchOutHigh signal 132 independent of the received Data signal 112 and the DataBar signal 102. Rather, the AOI gate 120 generates the LatchOutLow signal 122 based on the received LatchOutHigh signal 132 such as inverting the received LatchOutHigh signal 132. Similarly, the AOI gate 130 generates the LatchOutHigh signal 132 based on the received LatchOutLow signal 122 such as inverting the received LatchOutLow signal 122. Therefore, the AOI gates 120 and 130 of the master latch 160 retain the internal state of the flip-flop 100 when the BClk signal 116 is negated.

Similar to the master latch 160, the slave latch 170 of the flip-flop 100 uses two AOI gates such as the AOI gate 140 and the AOI gate 150. In contrast to the AOI gates 120 and 130 of the master latch 160, the AOI gates 140 and 150 of the slave latch 170 use the power supply voltage VIN2. In some embodiments, the power supply voltage VIN2 is capable of being powered down, or otherwise, transition to the logic low level. The inverter 134 generates the BClkBar signal 118 from the BClk signal 116 by inverting the level of the BClk signal 116. The AOI gate 140 generates the LatchOutLow signal 142 based on the received LatchOutHigh signal 132 and the received BClkBar signal 118. The AOI gate 150 generates the LatchOutHigh signal 152 based on the received LatchOutLow signal 122 and the received BClkBar signal 118. The inverter 144 generates the DataOut signal 108 from the LatchOutLow signal 142 by inverting the level of the LatchOutLow signal 142.

Although a single data output signal for the flip-flop 100 is shown, in other embodiments, the flip-flop 100 generates multiple data output signals using inverters, buffers and Boolean logic gates receiving the internal state of the flip-flop 100. As shown, the internal state of the flip-flop 100 are the LatchOutLow signal 122 and the LatchOutHigh signal 132. As shown, the flip-flop 100 uses two back-to-back, set-reset (SR) latches, and each of the SR latches uses two cross-coupled AOI gates such as AOI gates 120 and 130. This configuration ensures each device turns off when performing level shifting.

When an external power management unit determines a functional block using the flip-flop 100 is transitioning to (or is maintaining at) a power down mode, the power management unit asserts the Isolate signal 104. For example, the power management unit transitions the Isolate signal 104 to the logic high level while the power supply voltage VIN2 transitions to the logic low level. If the Isolate signal 104 is already at the logic high level, then the power management unit maintains the Isolate signal 104 at the logic high level. During these cases, the NOR gate 114 generates the BClk signal 116 by generating a logic low level for the BClk signal 116 based on the Isolate signal 104 being at the logic high level.

With the BClk signal 116 being at the logic low level, the master latch 160 closes. For example, the AOI gates 120 and 130 generate the LatchOutLow signal 122 and the LatchOutHigh signal 132 independent of the received Data signal 112 and the DataBar signal 102. Rather, the AOI gates 120 and 130 maintain the internal state of the flip-flop 100 based on the internal state of the flip-flop 100 where the internal state is defined by the LatchOutLow signal 122 and the LatchOutHigh signal 132. The slave latch 170 and the circuitry 180 are powered down, since VIN2 is at the logic low level. Power consumption is reduced while the internal state of the flip-flop 100 is maintained. In some embodiments, the power supply voltage VIN1 is less than the power supply voltage VIN2. The smaller power supply voltage VIN1 further reduces power consumption and provides level shifting for the flip-flop 100. For example, in some designs, the flip-flop 100 is placed between two different functional units that use different levels for the power supply voltages.

Again, as shown, the flip-flop 100 uses two back-to-back, set-reset (SR) latches, and each of the SR latches uses two cross-coupled AOI gates. This configuration ensures each device turns off when performing level shifting. Latches using transmission gates increase power consumption or create data corruption when level shifting, since the p-type device of the transmission gate does not fully turn off. If level shifting inverters are added to the latch to fully disable the p-type device of the transmission gate, then performance decreases. Therefore, using two cross-coupled AOI gates for the SR latches provides the ability to remove restrictions on the power supply voltages VIN1 and VIN2. For example, when using the two cross-coupled AOI gates for the SR latches, the power supply voltages VIN1 and VIN2 are capable of having a same voltage level. In addition, the power supply voltages VIN1 and VIN2 are capable of having different voltage levels with one at a higher voltage level than the other. In other words, the power supply voltages VIN1 and VIN2 are capable of supporting the relationships VIN1<VIN2, VIN1>VIN2, and VIN1=VIN2. Further, each of the power supply voltages VIN1 and VIN2 is capable of being powered down to the ground reference voltage level during the power down operating mode.

Figure 2:
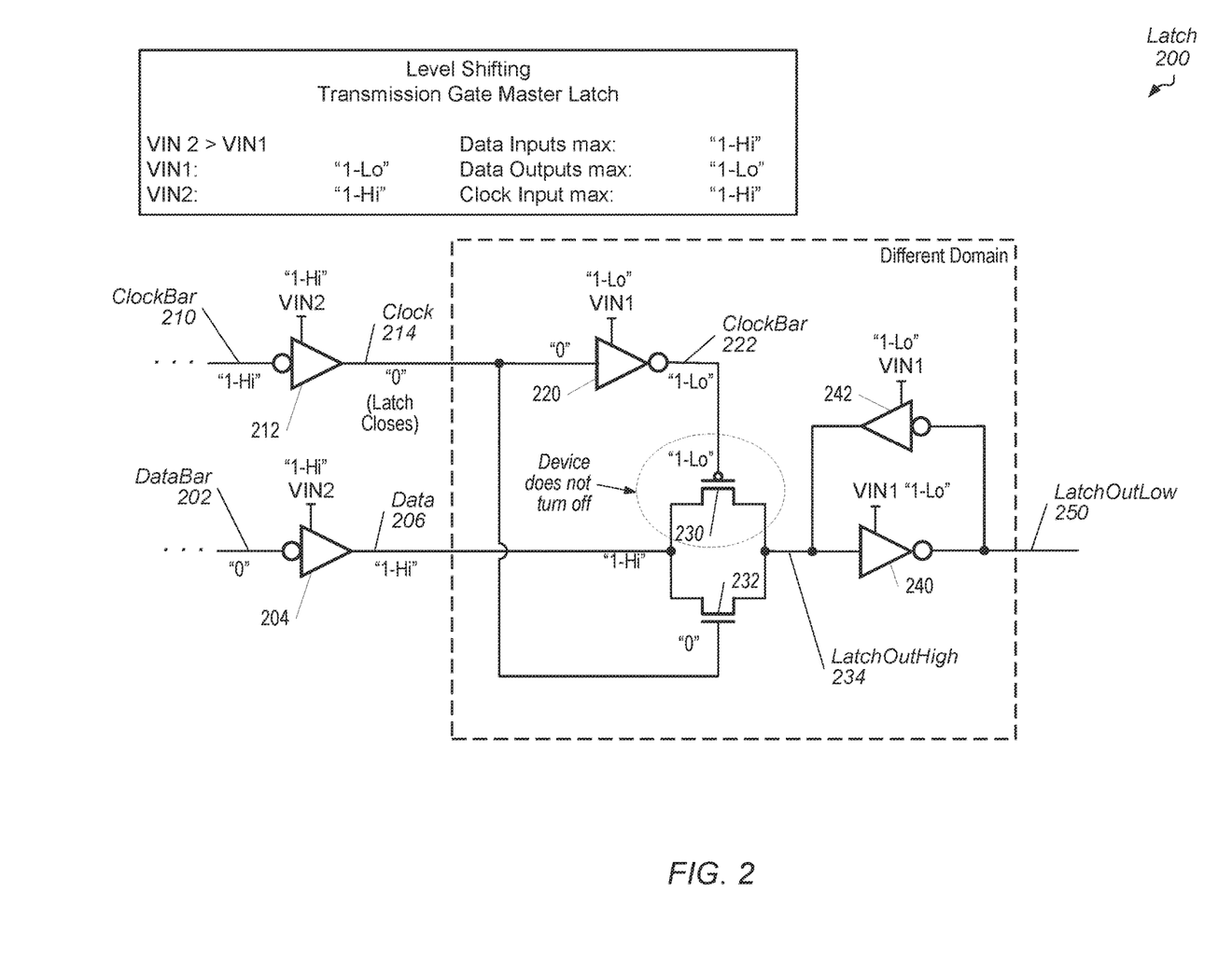
FIG. 2 is a block diagram of one embodiment of a latch.

Turning now to FIG. 2, a generalized block diagram of one embodiment of a latch circuit 200 is shown. The latch circuit 200 (or latch 200) receives a ground reference voltage level and a first power supply voltage designated as "VIN1." In an embodiment, the power supply voltage VIN1 is not powered down to the ground reference voltage level during a power down operating mode. Surrounding circuitry, such as the inverters 204 and 212 receive the ground reference voltage level and a second power supply voltage designated as "VIN2." In some embodiments, the power supply voltage "VIN2" is capable of being powered down to the ground reference voltage level during a power down operating mode. In one embodiment, the power supply voltage VIN2 is greater than the power supply voltage VIN1.

The latch 200 receives the DataBar signal 202 and the ClockBar signal 210, each based on the power supply voltage VIN2 used by external circuitry (not shown). The external inverter 204 receives the DataBar signal 202 and generates the Data signal 206 using the power supply voltage VIN2. Similarly, the external inverter 212 receives the ClockBar signal 210 and generates the Clock signal 214 using the power supply voltage VIN2. Although the inverters 204 and 212 are shown, in other embodiments, a variety of other Boolean gates and circuitry are used to generate the Data signal 206 and the Clock signal 214 using the power supply voltage VIN2. In an embodiment, the portion of the latch 200 operating in the separate voltage domain, such as the voltage domain using the power supply voltage VIN1, receives the Data signal 206 and the Clock signal 214 from the inverters 204 and 212. The portion of the latch 200 using the power supply voltage VIN1 generates the LatchOutLow signal 250. Although a single data output signal for the latch 200 is shown, in other embodiments, the latch 200 generates multiple data output signals using inverters, buffers and Boolean logic gates receiving the internal state of the latch 200.

The latch 200 includes the inverters 220, 240 and 242, and the p-type device 230 and n-type device 232, each using the power supply voltage VIN1. The latch 200 also uses a transmission gate formed by the p-type device 230 connected in a parallel manner with the n-type device 232. The inverter 220 receives the Clock signal 214 and generates the ClockBar signal 222, which is received by the gate terminal of the p-type device 230. Therefore, the inverter 220 performs level shifting from the power supply voltage VIN2 to the power supply voltage VIN1 when VIN1 and VIN2 are not equal. The gate terminal of the n-type device receives the Clock signal 214. One source/drain terminal of each of the p-type device 230 and the n-type device 232 receives the Data signal 206. The other source/drain terminal of each of the p-type device 230 and the n-type device 232 is connected to the input of the inverter 240 and receives the output of the inverter 242.

The cross-coupled inverters 240 and 242 maintain the internal state of the latch 200. The output of the transmission gate is the LatchOutHigh signal 234 and the output of the inverter 240, which is also the output of the latch 200, is the LatchOutLow signal 250. One problem with using a latch based on transmission gates when level shifting is highlighted in the latch 200. The voltage level of the ground reference voltage level is designated as "0." The voltage level of the smaller and always-on power supply voltage VIN1 is designated as "1-Lo," whereas, the voltage level of the larger power supply voltage VIN2 is designated as "1-Hi." In one example, the power supply voltage VIN1 is 0.4 volts, whereas, the power supply voltage VIN2 is 1.0 volts. In such a case, the voltage level "1-Lo" is 0.4 volts and the voltage level "1-Hi" is 1.0 volts. A variety of other voltage values for the designations "1-Lo" and "1-Hi" are possible and contemplated.

In the illustrated example, the DataBar signal 202 has a voltage level "0", and accordingly, the Data signal 206 has a voltage level "1-Hi." Therefore, the source/drain terminals of the transmission gate (p-type device 230 and n-type device 232) receives the voltage level "1-Hi." The ClockBar signal 210 has the voltage level "1-Hi", and accordingly, the Clock signal 214 has the voltage level "0." The gate terminal of the n-type device 232 receives the voltage level "0" and turns off. The inverter 220 receives the voltage level "0" and generates the ClockBar signal 222 with the voltage level "1-Lo" due to level shifting.

The gate terminal of the p-type device 230 receives the voltage level "1-Lo." The p-type device 230 should turn off due to receiving a logic high level on its gate terminal. However, the source terminal has a larger voltage level, such as "1-Hi," than the gate terminal that has the voltage level "1-Lo." Therefore, the p-type device 230 remains enabled and conducts current. Depending on the voltage difference between the voltage levels "1-Hi," "1-Lo," the threshold voltage of the p-type device 230, and the duration that this condition lasts, the p-type device 230 is capable of corrupting the data value of the LatchOutHigh signal 234. If data corruption does not occur, the p-type device 230 does increase power consumption with the conduction of leakage current.

In another example, the inverter 204 uses the power supply voltage VIN1, but receives the DataBar signal 202 based on the power supply voltage VIN2. If VIN2 is greater than VIN1, then the inverter 204 does not fully drive a logic low level, since the p-type device of the inverter 204 is not fully disabled when the DataBar signal 202 has a logic high level. If the latch 200 is used for both a master latch and a slave latch, and the master latch uses a smaller power supply voltage than the slave latch, then the resulting flip-flop circuit requires explicit level-shifting circuitry between the master latch and the slave latch. To prevent these and other issues, in some embodiments, the latches use implementations other than transmission gate implementations such as the back-to-back AOI gates as shown earlier.

Figure 3:
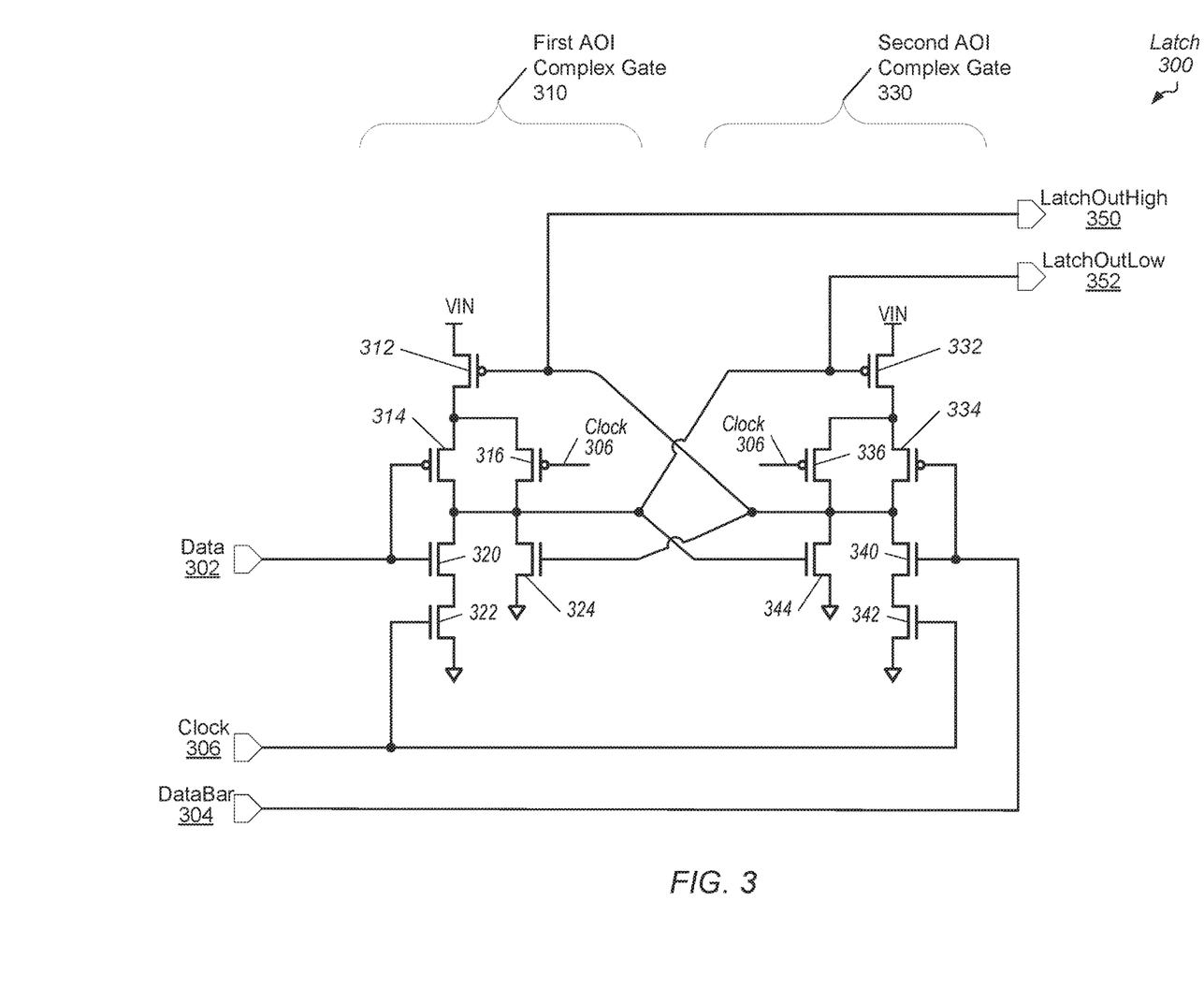
FIG. 3 is a block diagram of one embodiment of a latch.

Turning now to FIG. 3, a generalized block diagram of one embodiment of a latch circuit 300 is shown. The latch circuit 300 (or latch 300) receives the Data signal 302, the DataBar signal 304, and the Clock signal 306 and generates the LatchOutHigh signal 350 and the LatchOutLow signal 352. In some embodiments, the latch 300 includes an inverter for generating one of the Data signal 302 and the DataBar signal 304 based on which one of the two signals is not conveyed by external logic to the latch 300. Although the latch 300 is shown to receive the generic power supply voltage designated as "VIN," in some embodiments, one of the previously described power supply voltages VIN1 and VIN2 is used.

The latch 300 uses two cross-coupled AOI gates 310 and 330. In the illustrated embodiment, the AOI gate 310 receives each of the Data signal 302 and the Clock signal 306 and generates the LatchOutLow signal 352. Additionally, the AOI gate 310 receives the output of the AOI gate 330, which is the LatchOutHigh signal 350. Similarly, the AOI gate 330 receives the output of the AOI gate 310, which is the LatchOutLow signal 352. Therefore, the AOI gates 310 and 330 are cross-coupled AOI gates used to retain the internal state of the latch 300. The AOI gate 330 also receives the DataBar signal 304 and the Clock signal 306.

The AOI gate 310 uses the p-type devices 312, 314 and 316 as well as the n-type devices 320, 322 and 334. As shown, the single p-type device 312 in series with the parallel p-type devices 314 and 316 is on top of the stack of p-type devices, rather than at the bottom of the stack. In this manner, each of the p-type devices 312, 314 and 316 is capable of turning off unlike the p-type device 230 of a transmission gate used in the latch 200 (of FIG. 2). Similarly, the AOI gate 330 includes the p-type devices 332, 334 and 336 as well as the n-type devices 340, 342 and 344. As shown, the single p-type device 332 in series with the parallel p-type devices 334 and 336 is on top of the stack of p-type devices, rather than at the bottom of the stack. In this manner, each of the p-type devices 332, 334 and 336 is capable of turning off unlike the p-type device 230 of a transmission gate used in the latch 200 (of FIG. 2).

Each of the p-type device 314 and the n-type device 320 receives the Data signal 302 for the AOI gate 310. For the AOI gate 330, each of the p-type device 334 and the n-type device 340 receives the DataBar signal 304, which is the binary complement of the Data signal 302. For the AOI gate 310, each of the p-type device 316 and the n-type device 322 receives the Clock signal 306. Similarly, for the AOI gate 330, each of the p-type device 336 and the n-type device 342 receives the Clock signal 306. For the AOI gate 310, each of the top-of-the-stack p-type device 312 and the n-type device 324 receives the output of the AOI gate 330, which is the LatchOutHigh signal 350. For the AOI gate 330, each of the top-of-the-stack p-type device 332 and the n-type device 344 receives the output of the AOI gate 310, which is the LatchOutLow signal 352.

When the Clock signal 306 increases to a logic high level, the n-type devices 322 and 342 are turned on, whereas, the p-type devices 316 and 336 are turned off. The latch is considered to be open. Each of the Data signal 302 and the DataBar signal 304 is capable of changing the internal state of the latch 300 such as the LatchOutHigh signal 350 and the LatchOutLow signal 352. When the Data signal 302 increases to a logic high level, the n-type devices 320 is turned on and the p-type device 314 is turned off. The DataBar signal 304 decreases to a logic low level, so the n-type device 340 turns off and the p-type device 334 turns on. The enabled n-type device 320 and 322 drive a logic low level on the LatchOutLow signal 352. Accordingly, the p-type device 332 turns on, and the enabled p-type devices 332 and 334 drive a logic high level on the LatchOutHigh signal 350.

While the latch 300 is open, when the Data signal 302 decreases to a logic low level, and accordingly, the DataBar signal 304 increases to a logic high level, the devices turn on and off in an opposite fashion as described above for when the Data signal 302 decreases to a logic low level. Therefore, the enabled n-type devices 340 and 342 drive a logic low level on the LatchOutHigh signal 350, and the enabled p-type devices 312 and 314 drive a logic high level on the LatchOutLow signal 352. When the Clock signal 306 decreases to a logic low level, the n-type devices 322 and 342 are turned off, whereas, the p-type devices 316 and 336 are turned on. The latch is considered to be closed. Each of the Data signal 302 and the DataBar signal 304 is incapable of changing the internal state of the latch 300 such as the LatchOutHigh signal 350 and the LatchOutLow signal 352.

In some embodiments, the latch 300 is used as a master latch of a flip-flop circuit and the latch 300 uses the smaller and always-on power supply voltage VIN1. In such cases, the latch 300 receives the input signals, which are based on a larger power supply voltage such as the previous power supply voltage VIN2, but generates the LatchOutHigh signal 350 and the LatchOutLow signal 352 using the smaller and always-on power supply voltage VIN1. Unlike latches using transmission gates, the latch 300 has no p-type device that receives the smaller power supply voltage VIN1 on a gate terminal while a source or drain terminal receives the larger power supply voltage VIN2, which would cause the p-type device to not fully turn off. Rather, each p-type device in the latch 300 that receives the smaller power supply voltage VIN1 on a gate terminal also either receives the smaller power supply voltage VIN1 on a source or drain terminal, or has no logic high level or logic low level driving on its source or drain terminal.

Figure 4:
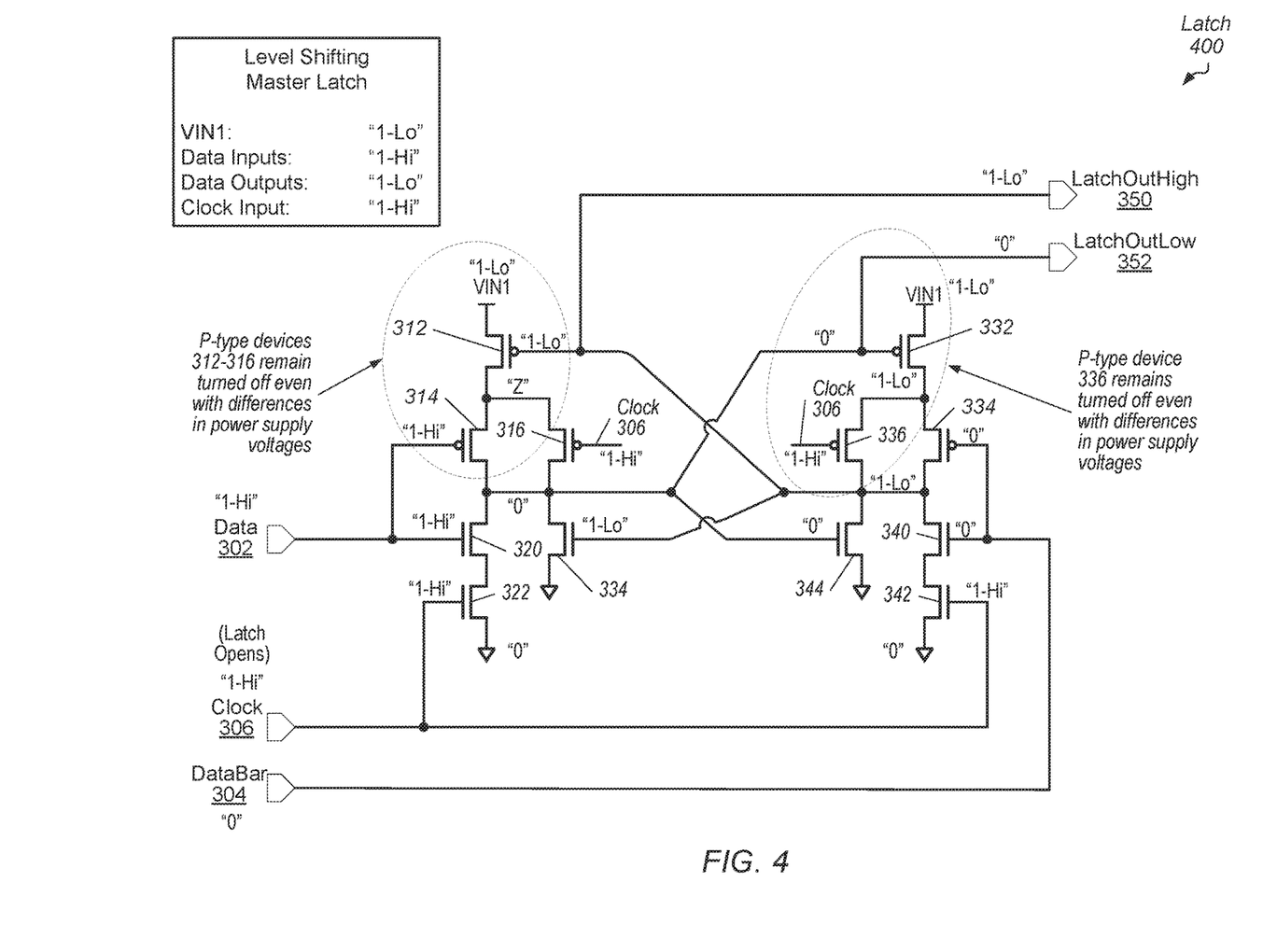
FIG. 4 is a block diagram of one embodiment of a latch.

Turning now to FIG. 4, a generalized block diagram of one embodiment of a latch circuit 400 is shown. Logic and circuitry previously described are numbered identically. The latch circuit 400 (or latch 400) receives a ground reference voltage level and an always-on power supply voltage designated as "VIN1." For example, the latch 400 is used as a level shifting master latch in a level shifting retention flip-flop circuit. The power supply voltage VIN1 is not powered down to the ground reference voltage level during a power down operating mode. Circuitry (not shown) that generates the input signals receive the ground reference voltage level and the larger power supply voltage VIN2, which is capable of being powered down to the ground reference voltage level during a power down operating mode.

As described earlier for the example shown for the latch 200 (of FIG. 2), the voltage level of the ground reference voltage level is designated as "0." The voltage level of the smaller and always-on power supply voltage VIN1 is designated as "1-Lo," whereas, the voltage level of the larger power supply voltage VIN2 is designated as "1-Hi." In the illustrated embodiment, the Data signal 302 has a voltage level "1-Hi," and accordingly, the DataBar signal has a voltage level "0." Therefore, the n-type device 320 and the p-type device 334 are enabled, whereas, the p-type device 314 and the n-type device 340 are disabled. The Clock signal 306 has the voltage level "1-Hi," so the latch 400 is open, and the n-type devices 322 and 342 are enabled, whereas, the p-type devices 316 and 336 are disabled.

The enabled n-type devices 320 and 322 drive a logic low level on the LatchOutLow signal 352, which enables the p-type device 332 and disables the n-type device 344. The enabled p-type devices 332 and 334 drive the voltage level "1-Lo" on the LatchOutHigh signal 350, which disables the p-type device 312 and enables the n-type device 334. The parallel-connected and disabled p-type devices 314 and 316 receive high impedance designated as "Z," since the disabled p-type device 312 prevents generating (driving) a logic high level or a logic low level on its drain terminal. In contrast, in the other AOI gate, the enabled p-type device 332 drives the voltage level "1-Lo" on its drain terminal, which is received by the source terminal of the disabled p-type device 336.

The disabled p-type device 336 receives the voltage level "1-Hi" on its gate terminal, whereas, its source terminal receives the voltage level "1-Lo." Despite the voltage difference between its source terminal and its gate terminal, the p-type device 336 remains disabled, since the source-to-gate difference is negative, rather than greater than the threshold voltage of the p-type device 336. Therefore, the level shifting master latch has no p-type devices remaining partially enabled when it should be completely disabled.

Figure 5:
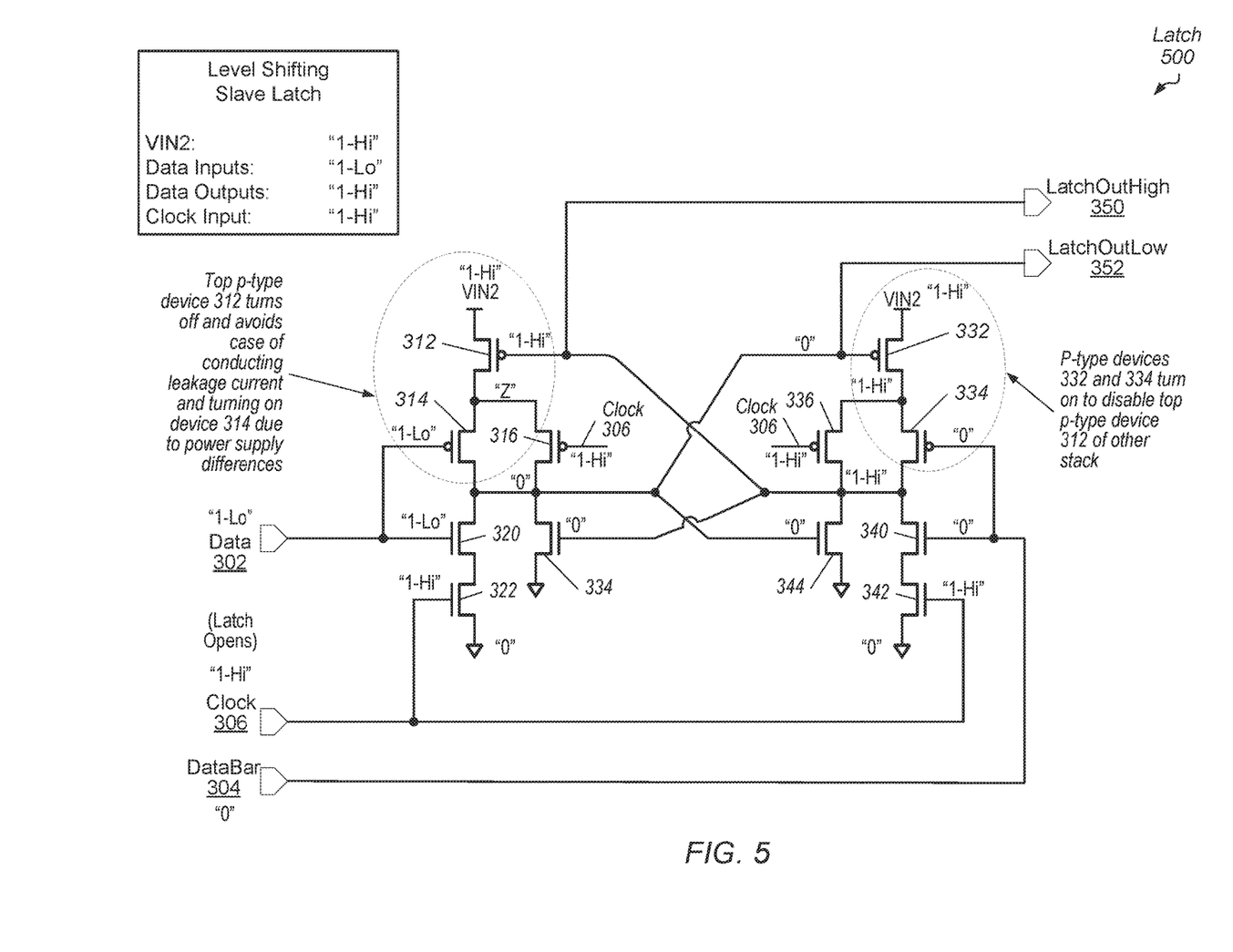
FIG. 5 is a block diagram of one embodiment of a latch.

Turning now to FIG. 5, a generalized block diagram of one embodiment of a latch circuit 500 is shown. Logic and circuitry previously described are numbered identically. The latch circuit 500 (or latch 500) receives a ground reference voltage level and the larger power supply voltage VIN2, which is capable of being powered down to the ground reference voltage level during a power down operating mode. For example, the latch 500 is used as a level shifting slave latch in a level shifting retention flip-flop circuit. Circuitry (not shown) that generates the data input signals receive the ground reference voltage level and an always-on power supply voltage designated as "VIN1," which is not powered down to the ground reference voltage level during a power down operating mode. Circuitry (not shown) that generates the input clock signal receive the ground reference voltage level and the larger power supply voltage VIN2.

As described earlier for the examples shown for the latches 200 400 (of FIG. 2 and FIG. 4), the voltage level of the ground reference voltage level is designated as "0." The voltage level of the smaller and always-on power supply voltage VIN1 is designated as "1-Lo," whereas, the voltage level of the larger power supply voltage VIN2 is designated as "1-Hi." In the illustrated embodiment, the Data signal 302 has a voltage level "1-Lo," and accordingly, the DataBar signal has a voltage level "0." Therefore, the n-type device 320 and the p-type device 334 are enabled, whereas, the p-type device 314 and the n-type device 340 are disabled. The Clock signal 306 has the voltage level "1-Hi," so the latch 400 is open, and the n-type devices 322 and 342 are enabled, whereas, the p-type devices 316 and 336 are disabled.

The enabled n-type devices 320 and 322 drive a logic low level on the LatchOutLow signal 352, which enables the p-type device 332 and disables the n-type device 344. The enabled p-type devices 332 and 334 drive the voltage level "1-Hi" on the LatchOutHigh signal 350, which disables the p-type device 312 and enables the n-type device 334. The parallel-connected and disabled p-type devices 314 and 316 receive high impedance designated as "Z," since the disabled p-type device 312 prevents driving a logic high level or a logic low level on its drain terminal. In contrast, in the other AOI gate, the enabled p-type device 332 drives the voltage level "1-Hi" on its drain terminal, which is received by the source terminal of the disabled p-type device 336.

The disabled p-type device 336 receives the voltage level "1-Hi" on its gate terminal and its source terminal also receives the voltage level "1-Hi." Therefore, there is no voltage difference between its source terminal and its gate terminal, and the p-type device 336 remains disabled. Similarly, the disabled p-type device 312 receives the voltage level "1-Hi" on its gate terminal and its source terminal also receives the voltage level "1-Hi." Therefore, there is no voltage difference between its source terminal and its gate terminal, and the p-type device 312 remains disabled. However, the disabled p-type device 314 receives the voltage level "1-Lo" on its gate terminal, whereas, its source terminal receives the high impedance "Z." The drain terminal of the disabled p-type device 314 receives the voltage level "0," so the drain-to-gate difference is negative, rather than greater than the threshold voltage of the p-type device 312. Therefore, the level shifting slave latch has no p-type devices remaining partially enabled when it should be completely disabled.

Figure 6:
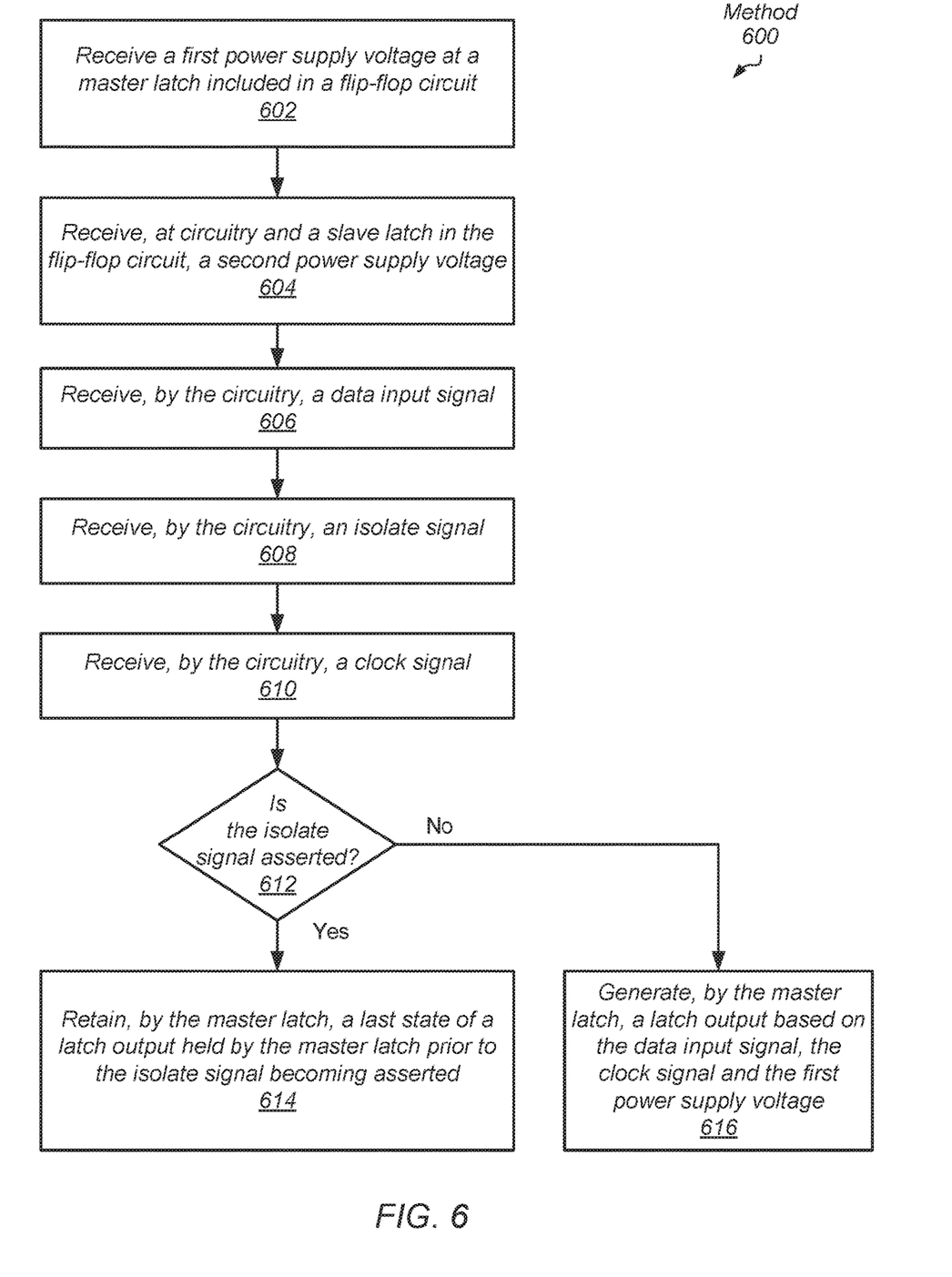
FIG. 6 is a flow diagram of one embodiment of a method for efficiently retaining data in sequential elements during power down modes.

Referring now to FIG. 6, a generalized flow diagram of one embodiment of a method 600 for efficiently retaining data in sequential elements during power down modes is shown. For purposes of discussion, the steps in this embodiment (as well as for FIG. 7) are shown in sequential order. However, in other embodiments some steps may occur in a different order than shown, some steps may be performed concurrently, some steps may be combined with other steps, and some steps may be absent.

A flip-flop circuit receives a first power supply voltage at a master latch included in the flip-flop circuit (block 602). In some embodiments, the first power supply voltage is an always-on power supply voltage. In other embodiments, the first power supply voltage is capable of transitioning to a ground reference voltage level during a power down operating mode. Each of a slave latch in the flip-flop circuit and circuitry that provides data input signals and clock input signals to the master latch receives a second power supply voltage (block 604). In some embodiments, the second power supply voltage is greater than the first power supply voltage. In an embodiment, the second power supply voltage is a power down power supply voltage capable of transitioning to the ground reference voltage level during a power down operating mode. The circuitry of the flip-flop circuit receives a data input signal (block 606). The circuitry of the flip-flop circuit receives an isolate signal (block 608). The circuitry of the flip-flop circuit receives a clock signal (block 610).

If the isolate signal is asserted ("yes" branch of the conditional block 612), then the master latch retains a last state of a latch output held by the master latch prior to the isolate signal becoming asserted (block 614). To retain the last state, the master latch prevents each of the data input signal and the clock signal from generating a voltage level on the latch output. Referring briefly again to the flip-flop 100 (of FIG. 1), when the Isolate signal 104 asserts, the BClk signal 116 transitions to a logic low level, and each of the AOI gates 120 and 130 prevent the DataBar signal 102, the Data signal 112 and the ClockBar signal 106 from generating a voltage level on either one of the LatchOutLow signal 122 and the LatchOutHigh signal 132. The state of the master latch 160 includes each of the LatchOutLow signal 122 and the LatchOutHigh signal 132. When the Isolate signal 104 becomes asserted, the master latch 160 retains the last voltage levels of the LatchOutLow signal 122 and the LatchOutHigh signal 132 held (stored) by the master latch 160 prior to the Isolate signal 104 becoming asserted. Returning to method 600, if the isolate signal is negated ("no" branch of the conditional block 612), then the master latch generates a first latch output based on the data input signal and the clock signal (block 616).

Figure 7:
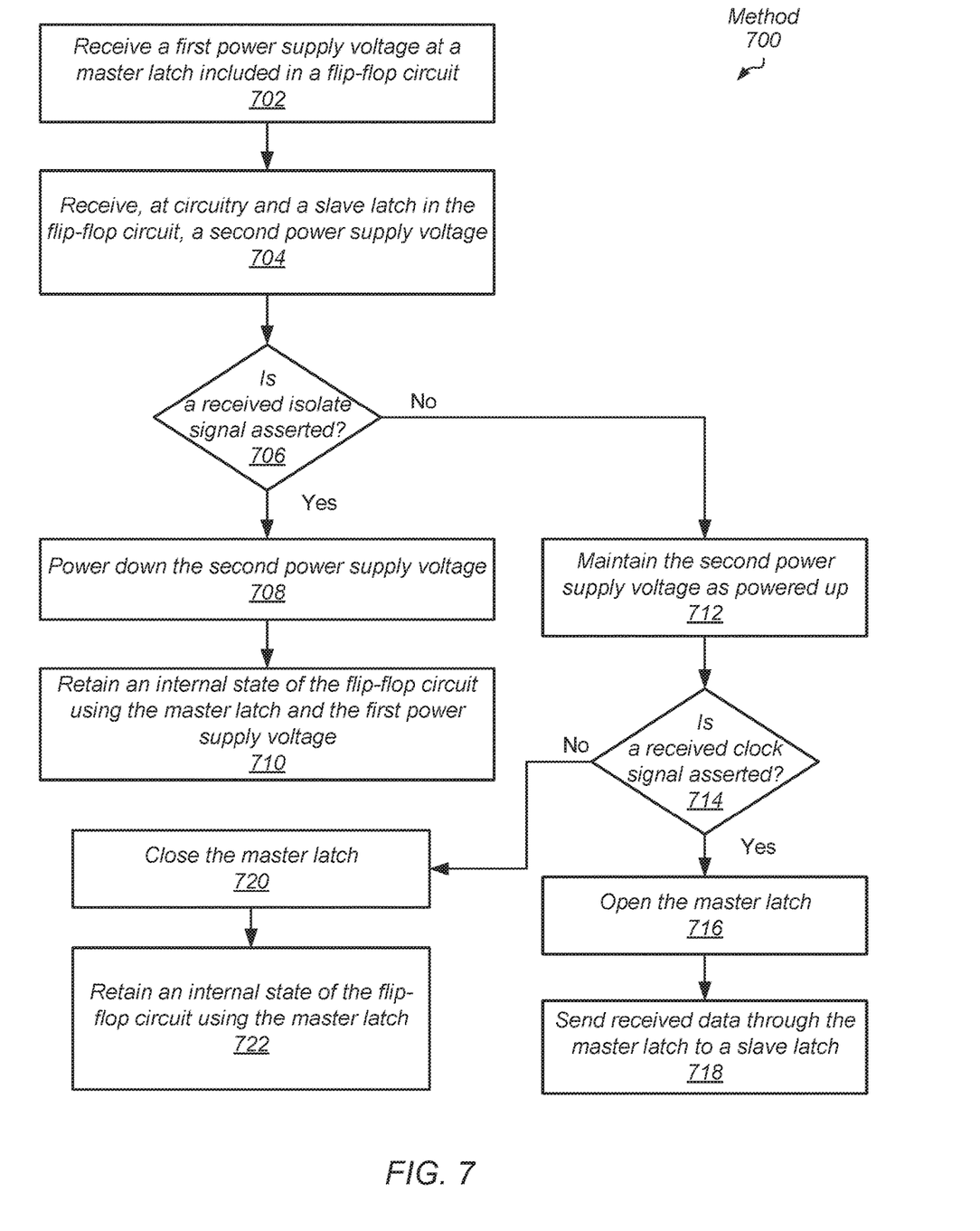
FIG. 7 is a flow diagram of one embodiment of a method for efficiently retaining data in sequential elements during power down modes.

Referring now to FIG. 7, a generalized flow diagram of one embodiment of a method 700 for efficiently retaining data in sequential elements during power down modes is shown. A flip-flop circuit receives a first power supply voltage at a master latch included in the flip-flop circuit (block 702). In some embodiments, the first power supply voltage is an always-on power supply voltage. In other embodiments, the first power supply voltage is capable of transitioning to a ground reference voltage level during a power down operating mode. Each of a slave latch in the flip-flop circuit and circuitry that provides data input signals and clock input signals to the master latch receives a second power supply voltage (block 704). In some embodiments, the second power supply voltage is greater than the first power supply voltage. In an embodiment, the second power supply voltage is a power down power supply voltage capable of transitioning to the ground reference voltage level during a power down operating mode.

If a received isolate signal is asserted ("yes" branch of the conditional block 706), then the second power supply voltage powers down (block 708). In various embodiments, the first power supply voltage is maintained at a positive, non-zero voltage level. The master latch retains an internal state of the flip-flop circuit using the first power supply voltage (block 710). If the received isolate signal is negated ("no" branch of the conditional block 706), then a power supply maintains the second power supply voltage as powered up (block 712). If a received clock signal is asserted ("yes" branch of the conditional block 714), then the master latch of the flip-flop circuit opens (block 716). The open master latch sends received data to a slave latch (block 718).

If a received clock signal is negated ("no" branch of the conditional block 714), then the master latch of the flip-flop circuit closes (block 720). The master latch retains an internal state of the flip-flop circuit (block 722). In some embodiments, the first power supply voltage is less than the second power supply voltage. Therefore, any p-type device that receives the smaller first power supply voltage on its gate terminal while receiving the larger second power supply voltage on its source terminal does not fully disable. This p-type device continues to conduct current despite receiving a logic high level on its gate terminal. Each of the level shifting master latch and slave latch has no p-type devices remaining partially enabled when it should be completely disabled. In addition, by using an embodiment similar to the latch 300 (of FIG. 3), the retention flip-flop circuit prevents transferring the internal state to a separate retention latch, such as a balloon latch, when transitioning between active modes and power down modes.

Figure 8:
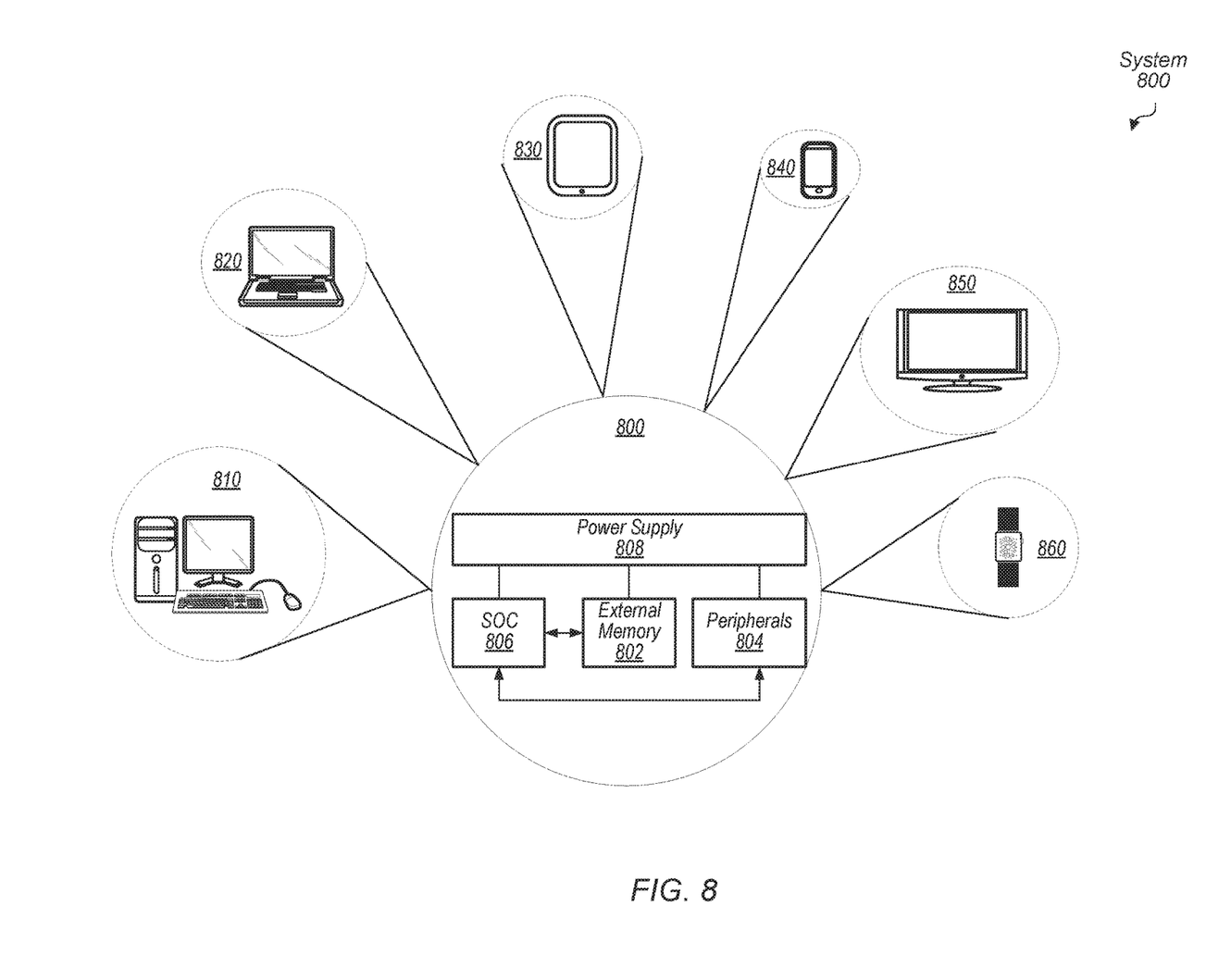
FIG. 8 is a block diagram of one embodiment of a system.

Turning next to FIG. 8, a block diagram of one embodiment of a system 800 is shown. As shown, system 800 represents chip, circuitry, components, etc., of a desktop computer 810, laptop computer 820, tablet computer 830, cell or mobile phone 840, television 850 (or set top box coupled to a television), wrist watch or other wearable item 860, or otherwise. Other devices are possible and are contemplated. In the illustrated embodiment, the system 800 includes at least one instance of a system on chip (SoC) 806 which includes multiple processors and a communication fabric. In some embodiments, the SoC 806 includes sequential elements, which include the retention flip-flop circuit 100 (of FIG. 1) and latch 300 (of FIG. 3). In various embodiments, SoC 806 is coupled to external memory 802, peripherals 804, and power supply 808.

The power supply 808 provides the power supply voltages to SoC 806 as well as one or more power supply voltages to the memory 802 and/or the peripherals 804. In various embodiments, power supply 808 represents a battery (e.g., a rechargeable battery in a smart phone, laptop or tablet computer). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid-state storage, or disk storage. The peripherals 804 include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist including a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
a master latch configured to:
receive a first power supply voltage; and
receive a first clock signal that is generated based on a second power supply voltage different from the first power supply voltage, wherein the first clock signal has a clock frequency determined by an operating state of the master latch indicated by a power management unit; and
circuitry; and
wherein the circuitry is configured to:
receive the second power supply voltage different from the first power supply voltage;

receive a second clock signal using the second power supply voltage; and generate the first clock signal based on the second clock signal using the second power supply voltage; and wherein the master latch is configured to, based at least upon a determination that the first clock signal is negated, retain a last state of a first latch output held by the master latch before the first clock signal became negated.

2. The apparatus as recited in claim 1, wherein the first power supply voltage is less than the second power supply voltage.

3. The apparatus as recited in claim 2, wherein a first p-type device of the master latch using both the first power supply voltage and the second power supply voltage is configured to, based at least in part on a detection that its gate terminal has the first power supply voltage, prevent generating any voltage level on its drain terminal.

4. The apparatus as recited in claim 3, wherein the first p-type device is at a top of a stack of p-type devices used to implement a first Boolean AND-OR-INVERT (AOI) complex gate.

5. The apparatus as recited in claim 4, wherein the first p-type device receives an output of a second Boolean AOI complex gate, wherein the first AOI complex gate and the second AOI complex gate are connected in a cross-coupled manner.

6. The apparatus as recited in claim 2, wherein the apparatus further comprises a slave latch configured to:
receive the second power supply voltage; and
based at least in part on a detection that a gate terminal of a second p-type device of the slave latch has the first power supply voltage, prevent generating any voltage level on a drain terminal of the second p-type device.

7. The apparatus as recited in claim 6, wherein the second p-type device is at a bottom of a stack of p-type devices used to implement a third Boolean AOI complex gate.

8. The apparatus as recited in claim 7, wherein the second p-type device receives an output of the master latch using the first power supply voltage as a logic high level.

9. The apparatus as recited in claim 3, wherein the circuitry is further configured to:
receive an isolate signal using the second power supply voltage;
based at least in part on detecting the isolate signal is asserted:
maintain the first power supply voltage at a positive, non-zero voltage level; and
transition the second power supply voltage to a ground reference voltage level.

10. A method, comprising:
receiving, by a master latch, a first power supply voltage;
receiving, by the master latch, a first clock signal that is generated based on a second power supply voltage different from the first power supply voltage, wherein the first clock signal has a clock frequency determined by an operating state of the master latch indicated by a power management unit receiving, by circuitry, the second power supply voltage different from the first power supply voltage;
receiving, by the circuitry, a second clock signal using the second power supply voltage; and
generating, by the circuitry, the first clock signal based on the second clock signal using the second power supply voltage;
in response to detecting the first clock signal being negated, retaining, by the master latch, a last state of a first latch output held by the master latch before the first clock signal became negated.

11. The method as recited in claim 10, wherein the first power supply voltage is less than the second power supply voltage.

12. The method as recited in claim 11, further comprising preventing generating, by a first p-type device of the master latch using both the first power supply voltage and the second power supply voltage, any voltage level on a drain terminal of the first p-type device responsive to receiving the first power supply voltage on a gate terminal of the first p-type device.

13. The method as recited in claim 12, wherein the first p-type device is at a top of a stack of p-type devices used to implement a first Boolean AND-OR-INVERT (AOI) complex gate.

14. The method as recited in claim 11, further comprising:
receiving, by a slave latch, the second power supply voltage; and
preventing generating, by a second p-type device of the slave latch, any voltage level on a drain terminal of the second p-type device responsive to receiving the first power supply voltage on a gate terminal of the second p-type device.

15. The method as recited in claim 14, wherein the second p-type device is at a bottom of a stack of p-type devices used to implement a third Boolean AOI complex gate.

16. A non-transitory computer readable storage medium storing program instructions, wherein the program instructions are executable by a processor to:
receive, by a master latch, a first power supply voltage;
receive, by the master latch, a first clock signal that is generated based on a second power supply voltage different from the first power supply voltage, wherein the first clock signal has a clock frequency determined by an operating state of the master latch indicated by a power management unit;
receive, by circuitry, the second power supply voltage different from the first power supply voltage;
receive, by the circuitry, a second clock signal using the second power supply voltage; and
generate, by the circuitry, the first clock signal based on the second clock signal using the second power supply voltage;
in response to detecting the first clock signal being negated, retain, by the master latch, a last state of a first latch output held by the master latch before the first clock signal became negated.

17. The non-transitory computer readable storage medium as recited in claim 16, wherein the first power supply voltage is less than the second power supply voltage.

18. The non-transitory computer readable storage medium as recited in claim 17, wherein in response to receiving the first power supply voltage on a gate terminal of a first p-type device of the master latch using both the first power supply voltage and the second power supply voltage, the program instructions are further executable by a processor to prevent generating, by the first p-type device of the master latch, any voltage level on a drain terminal of the first p-type device.

19. The non-transitory computer readable storage medium as recited in claim 18, wherein the first p-type device is at a top of a stack of p-type devices used to implement a first Boolean AND-OR-INVERT (AOI) complex gate.

20. The non-transitory computer readable storage medium as recited in claim 17, wherein the program instructions are executable by a processor to:

receive, by a slave latch, the second power supply voltage; and prevent generating, by a second p-type device of the slave latch, any voltage level on a drain terminal of the second p-type device responsive to receiving the first power supply voltage on a gate terminal of the second p-type device.

\* \* \* \* \*

UNITED STATES PATENT AND TRADEMARK OFFICE
CERTIFICATE OF CORRECTION

PATENT NO. : 11,005,459 B1
APPLICATION NO. : 16/391085
DATED : May 11, 2021
INVENTOR(S) : Hess et al.

Page 1 of 1

It is certified that error appears in the above-identified patent and that said Letters Patent is hereby corrected as shown below:

In the Claims

Column 15, Claim 10, Line 58, please delete "unit receiving," and substitute -- unit; receiving," --.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*